United States Patent [19]

Kodama et al.

[11] Patent Number: 5,215,620
[45] Date of Patent: Jun. 1, 1993

[54] METHOD FOR PULLING A SILICON SINGLE CRYSTAL BY IMPOSING A PERIODIC ROTATION RATE ON A CONSTANT ROTATION RATE

[75] Inventors: Yoshihiro Kodama; Tetsuya Ishidaira, both of Nishigo; Koji Kanno, Shirakawa; Shin-ichi Furuse, Nishigo, all of Japan

[73] Assignee: Shin-Etsu Handotai Co. Ltd., Tokyo, Japan

[21] Appl. No.: 814,040

[22] Filed: Dec. 24, 1991

Related U.S. Application Data

[63] Continuation of Ser. No. 577,102, Sep. 4, 1990, abandoned.

[30] Foreign Application Priority Data

Sep. 19, 1989 [JP] Japan ................................ 1-243149

[51] Int. Cl.⁵ .............................................. C30B 15/26
[52] U.S. Cl. .................... 156/618.1; 156/620.4
[58] Field of Search ................. 156/601, 617.1, 618.1, 156/620.4, DIG. 64

[56] References Cited

U.S. PATENT DOCUMENTS

| | | | |
|---|---|---|---|
| 2,889,240 | 6/1959 | Rosi | 422/249 |
| 3,342,560 | 9/1967 | Starnberg et al. | 422/249 |
| 3,493,770 | 2/1970 | Dessauer et al. | 156/617.1 |
| 3,929,577 | 12/1975 | Goodrum | 156/618.1 |
| 4,239,585 | 12/1980 | Köhl | 156/DIG. 64 |
| 4,551,196 | 11/1985 | Capper et al. | 156/616 R |

FOREIGN PATENT DOCUMENTS

| | | | |
|---|---|---|---|
| 0055619 | 7/1982 | European Pat. Off. | |
| 0098471 | 1/1984 | European Pat. Off. | |
| 88287156 | 10/1988 | European Pat. Off. | 156/617.1 |
| 2328509 | 5/1977 | France | |
| 0152683 | 12/1979 | Japan | 156/601 |
| 59-156265 | 5/1984 | Japan | 156/618.1 |
| 1519725 | 8/1978 | United Kingdom | |

OTHER PUBLICATIONS

Krumbhaar et al., "Controlled Crystal Pulling with Accelerated Crucible Rotation" IBM T.D.B. pp. 903-904 vol. 17 No. 3, Aug. 1974.
Journal of Crystal Growth, vol. 49, No. 2, Jun. 1980, pp. 291-296 P. Scheel et al. "Crystal Pulling Using ACRT".

*Primary Examiner*—Olik Chaudhuri
*Assistant Examiner*—Ken Horton
*Attorney, Agent, or Firm*—Longacre & White

[57] ABSTRACT

This is a new method for pulling a silicon single crystal. When the silicon single crystal is pulled from a quartz crucible which is provided with a rotation rate more than zero, exclusive of zero rpm according to the Czochralski process, a reference rotation rate of the quartz crucible is controlled by a predetermined program. This method is characterized in that a pulse-like increase or decrease in a rotation rate is superimposed to the reference rotation rate and differences in and cycles of the rotation rate are set by the predetermined program.

14 Claims, 10 Drawing Sheets

METHOD FOR PULLING A SILICON SINGLE CRYSTAL BY IMPOSING A PERIODIC ROTATION RATE ON A CONSTANT ROTATION RATE

Thi is a continuation of application Ser. No. 07/577,102, filed Sep. 4, 1990, which is abandoned.

BACKGROUND OF THE INVENTION

1. Industrial Field of the Invention

The present invention relates to a method for pulling a silicon single crystal according to the Czochralski process, and more particularly to a method for achieving a uniform axial and radial oxygen concentration of a silicon single crystal.

2. Statement of the Related Art

When a silicon single crystal is prepared according to the Czochralski process, polycrystalline silicon as a material contained in a quartz crucible is heated to melt and form a silicon melt, into which a seed crystal is immersed, whereby the seed crystal is drawn slowly to grow a single crystal silicon rod. The surface of the quartz crucible in contact with the silicon melt (approximately 1,450° C.) is dissolved and evaporated in part as silicon monoxide from the surface of the melt. The balance of the dissolved surface is incorporated into the growing silicon single crystal. In general, the oxygen concentration distribution of the silicon single crystal pulled according to the Czochralski process is not uniform in the bulk, that is, axially higher at the portion solidified initially and lower at the portion solidified later. For example, the oxygen concentration of the portion solidified initially is $3 \times 10^{18}$ atoms/cc of oxygen, while that of the tail end portion of the pulled single crystal rod is exceedingly reduced to $6 \times 10^{17}$ atoms/cc. Radially, on the other hand, the concentration is higher at the center and lower at the periphery. The ratio of variation in oxygen concentration from center to periphery amounts to 15%.

Oxygen dissolved in silicon single crystal forms microdefects when subjected to heat treatment. The presence of dissolved oxygen in the active layer region of the surface of the semiconductor crystal substrate causes the maknig of nuclei which originate stacking faults during thermal oxidation of the surface, and which have an unfavorable influence on fundamental characteristics of semiconductor devices. In recent years, however, such microdefects are forced to be generated in the bulk of a semiconductor substrate so that the microdefects can be positively used only as a gettering center of impurities. In addition, to positively use of the microdefects, a technology has been developed whereby the active layer region is made defect-free with the help of gettering effect of the microdefects in the bulk. Therefore, oxygen of solid solution is indispensable now. Such a treatment is called an intrinsic gettering process which is an inevitable technology for semiconductor integrated circuits.

In this sense, it is required that the concentration of oxygen dissolved in pulled silicon single crystal is as uniform as possible both axially and radially. As such technologies for controlling oxygen concentration distribution in a silicon single-crystal rod there are the following:

(1) A method wherein the rotation of a quartz crucible is brought to a complete stop periodically to make use of fluid friction in the vicinity of the solid-liquid interface (Japanese Patent Examined Publication No. 53-29677).

(2) A method wherein an oxygen concentration profile in a silicon single-crystal rod is measured to control the rotation rate of the crucible so that the rotation will be varied in a reverse relationship with the measured profile (Japanes.e Patent Examined Publication No. 60-6911).

(3) A method wherein a silicon single-crystal rod and a quartz crucible rotate in a reverse direction with each other. The silicon single-crystal rod rotates faster than the crucible. The rotation rate of the quartz crucible increases with the length of the silicon rod increasing in growth (Japanese Patent Laid-Open Publication No. 57-135796). None of them are satisfactory.

According to the method (1), it is necessary that the quartz crucible should be completely suspended momentarily. The large volume of the melt contained in the crucible in accordance with the recent trend where the diameters of the quartz crucibles are large makes it hard physically to stop the crucible abruptly because of the mass of the melt and the mechanical structure of a driving means. A momentary complete suspension of the crucible, if possible, would produce a thermal instability of the melt within the quartz crucible. As a result, an unfavorable solidification of the melt in part at the bottom of the crucible would follow. Further, such a mere momentary complete stop of the crucible would not improve an axial oxygen concentration profile.

According to the method (2), when the oxygen concentration is reducing along the length of the silicon rod, the rotation rate of the crucible is caused to increase. This method is not practical, since a complicated procedure will follow in determining a suitable rate of rotation of the quartz crucible. Furthermore, this method would not improve the radial oxygen concentration profile.

The method (3) resembles the method (2). If attention is paid only to the rotation of the quartz crucible, this method is equivalent to a case where the oxygen concentration profile in a silicon single crystal reduces lengthwise uniformly. According to this method, the rotation of the crystal is selected to be in a reverse direction relative to the rotation of the quartz crucible, and further, programmed to be progressively faster. This method, however, does not necessarily improve the radial oxygen concentration distribution.

SUMMARY OF THE INVENTION

In the light of the drawbacks of conventional technologies as stated above, the present invention provides a process for facilitating to control the variance in the axial and radial oxygen concentration profile of a silicon single-crystal rod drawn from a quartz crucible according to the Czochralski process not more than 10%, preferably 5% or less.

In order to realize the above process according to the present invention, in pulling a silicon single crystal from a silicon melt within a quartz crucible according to the Czochralski process, while the quartz crucible is maintained at a reference rate of rotation more than zero, exclusive of zero, the reference rates of rotation of the crucible is controlled in accordance with a predetermined program for the duration of the entire pulling process. Further, an increase or reduction in the rotation rate in a pulse-like pattern superimposed to the reference rotation of the crucible (i.e., change in the amplitude as shown in FIG. 15) and an increase or reduction in the cycle of the pulse-like pattern (i.e., change in the frequency as shown in FIG. 18) are controlled according to a predetermined program.

Therefore, it is possible to shape the above stated program into a cyclic pattern wherein the crucible rotation rate increases or decreases with passage of time (FIG. 15). The retention time during which a certain reference rate of rotation is held and the retention time during which a positive or negative additional rate of rotation superimposed ahead of or following the reference rate can be increased or reduced respectively in the course of the pulling of a silicon single crystal (FIG. 22).

The reference rate of the crucible rotation can be arbitrarily set between 0.1 to 50 rpm. In case the reference rate of rotation is 0.1 rpm or less, the temperature of the melt in the quartz crucible would turn uneven. In some cases, part of the silicon melt often solidifies at the bottom of the crucible, thereby making it difficult to pull the crystal. On the other hand, in case the reference rate of rotation is 50 rpm and over, the melt itself would vibrate and undulate by mechanical causes, whereby making it also difficult to draw the crystal.

As an embodiment according to the present invention, the reference rate of rotation stated above is set, for instance, at 8 or 10 rpm. The rate of rotation is increased or decreased at a predetermined cycle in a pulse-like pattern. In general, the superimposed change in the rate ranges from 0.1 to 50 rpm. Owing to a structure of the rotating mechanism and a possible eccentricity of the quartz crucible of the pulling device it is preferable that the upper limit of the total actual rate of rotation (reference rate of rotation +maximal superimposed rate) should be set at 50 rpm. In case a reference rate of rotation is 8 rpm, the upper limit of the superimposed change is in the vicinity of 42 rpm. Under this condition, as in the case wherein the rotation rate is held at a reference rate, that is, constant, the oxygen concentration is higher at the initially solidified portion of the pulled single crystal, and lower as the solidification closes to the tail portion. But the oxygen concentration is in general at a higher level and radially more uniform than held at the constant rate of 8 rpm and an increase of the value of the superimposed change of rate in accordance with an increase of the growth length of the pulled single crystal will result in dramatically uniform distribution of oxygen concentration in the axial and radial direction.

In case the quartz crucible is subjected to change in the rotation rate in a pulse-like pattern, prolongation of the retention time of increased rotation rate and/or the retention time of reference rotation rate causes the axial oxygen concentration of a pulled silicon single crystal to be generally increased compared with that at the reference rate. The retention time of increased rotation rates can be suitably selected between 1 and 600 sec. The effect of an increase in oxygen concentration cannot be seen below or above the above range. The range of the retention time should preferably be 10 to 180 sec, within which the above effect can be better expected. Too short retention time of increased rotation rate causes a failure in follow-up of the movement of the silicon melt with the movement of the quartz crucible. Too long retention time does not allow the uniformity in the radial oxygen concentration. The ratio of the retention time of reference rotation rate to the retention time of increased rotation rate can be suitably selected between 1:99 and 99:1. The range of the ratio should preferably be 2:8 to 8:2, within which the effect of an increase in oxygen concentration can be obtained. It is to be noted that the retention time and the rotation rate can be increased at the same time according to the length of the pulled silicon single crystal.

The process according to the present invention determines the rotation rate of the quartz crucible to be increase or decreased in a pulse-like pattern based on the axial oxygen concentration profile of a silicon single crystal rod with the constant reference rotation rate of a quartz crucible. Variety of pulse-like patterns including the rotation rate and the retention times allows a desired axial oxygen concentration profile to be obtained and the operation of the process is quite easy. Further, the application of the present invention will allow the variance in the radial oxygen concentration profile to be controlled less than 10%, and it is possible to make the variance even less than 5%.

DESCRIPTION OF THE PREFERRED EMBODIMENTS

The present invention will be described further more particularly by enumerating the preferred embodiments. It is needless to say that the present invention is not restricted only to the preferred embodiments.

EMBODIMENT 1

Figure 1:
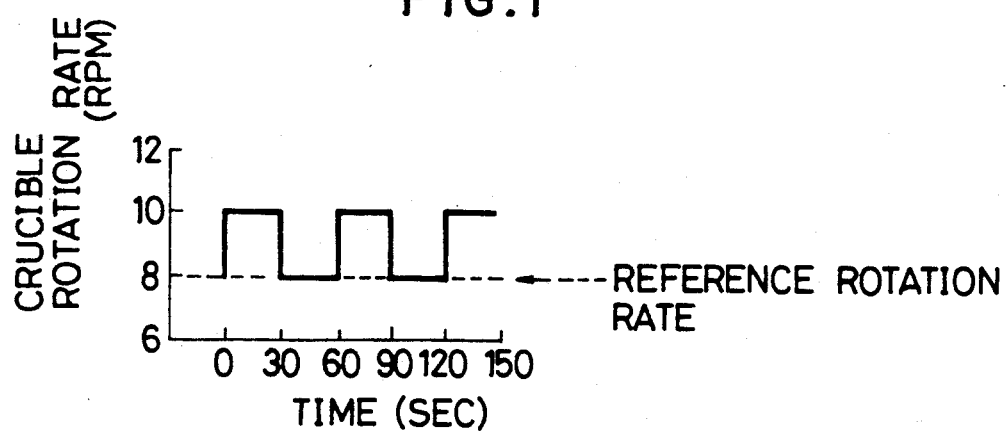
FIG. 1 is a graph showing in part how the quartz crucible used in Embodiment 1 rotates.

Case wherein both the range (2.0 rpm) and the cycle (60 sec; the period of time of reference rotation/the period of time of accelerated rotation = 1/1) of change in the rotation rate are constant A silicon single crystal 150 mm in diameter and about 40 cm in length was pulled from a quartz crucible 440 mm in internal diameter containing 30 kg of molten silicon under the conditions written below. The reference rate of rotation of the quartz crucible was 8.0 rpm as shown in FIG. 1, the range of change in the rotation rate was maintained at 2.0 rpm (i.e., the accelerated rate of rotation was 10.0 rpm.), and the cycle of change in the rate was maintained at 60 sec (the period of time of reference rotation/the period of time of accelerated rotation = 1/1). The crystal rotation rate was 20 rpm in the reverse direction relative to the quartz crucible rotation.

Figure 2:
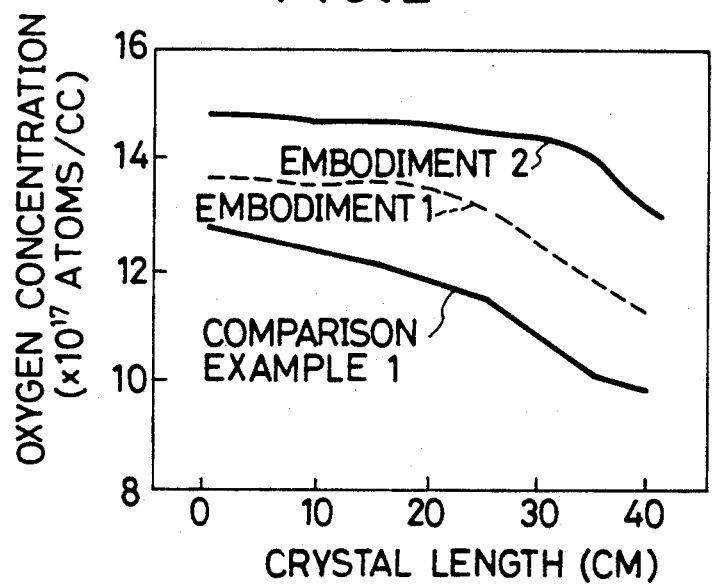
FIG. 2 is a graph showing the axial oxygen concentration of the silicon single crystals obtained according to Embodiments 1 and 2 and Comparison Example 1.
Figure 5:
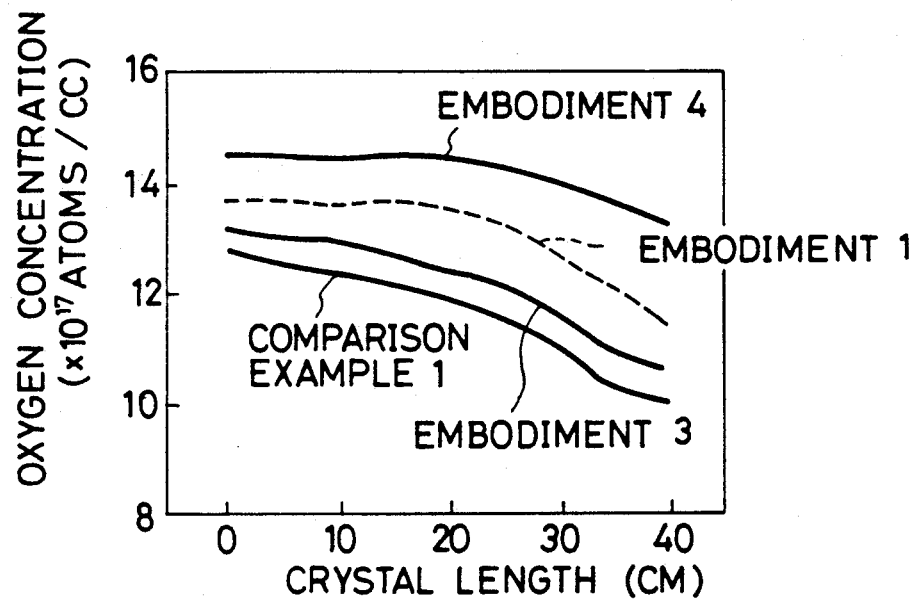
FIG. 5 is a graph showing the axial oxygen concentration of the silicon single crystals obtained according to Embodiments 1, 3 and 4 and Comparison Example 1.

The measurements of the axial oxygen concentration of the silicon single crystal thus obtained are shown in FIGS. 2 and 5. These figures indicate that the axial oxygen concentration of the silicon single crystal obtained by this embodiment was improved compared with that of a silicon single crystal (Comparison Example 1 to be described later) obtained by a conventional method. The measurement of the axial oxygen concentration of the silicon single crystal was conducted as follows: With the shoulder portion of the silicon single crystal as a starting point, the crystal thus obtained was cut into wafers each 2.0 mm thick at intervals of 5 cm. Then a wet etching was performed on both surfaces of the wafers, whereby the oxygen concentrations of the center portions thereof were measured by Fourier transform infrared absorption spectrophotometer.

EMBODIMENT 2

Figure 3:
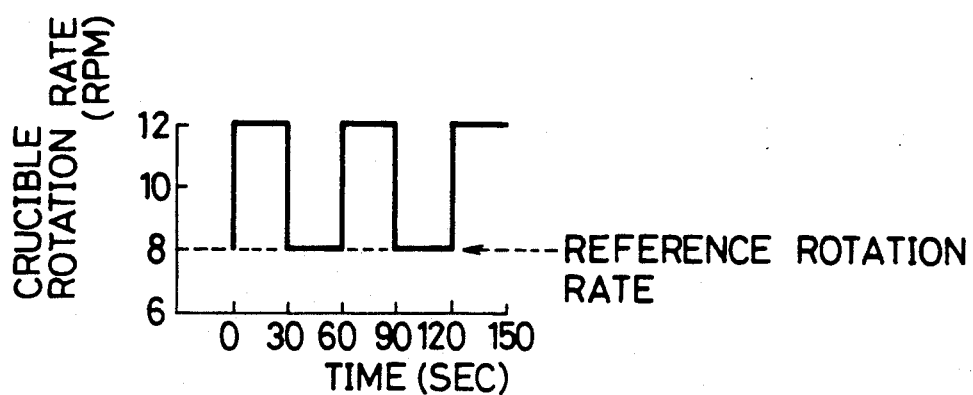
FIG. 3 is a graph showing in part how the quartz crucible used in Embodiment 2 rotates.

Case wherein both the range (4.0 rpm) and the cycle (60 sec; the period of time of reference rotation/the period of time of accelerated rotation = 1/1) of change in the rotation rate are constant As shown in FIG. 3, a silicon single crystal was obtained in the same method as Embodiment 1, except for the range of change in the rotation rate set at 4.0 rpm (i.e., the accelerated rotation rate is 12.0 rpm.) The oxygen concentration of the silicon single crystal was measured in the same process as Embodiment 1, the result of which is shown in FIG. 2. This figure confirms that the oxygen concentration of the silicon single crystal obtained by this embodiment was furthermore improved compared with Comparison Example 1 (to be described later) and Embodiment 1.

COMPARISON EXAMPLE 1

Case where no change in the rotation rate is made (conventional methods)

Figure 4:
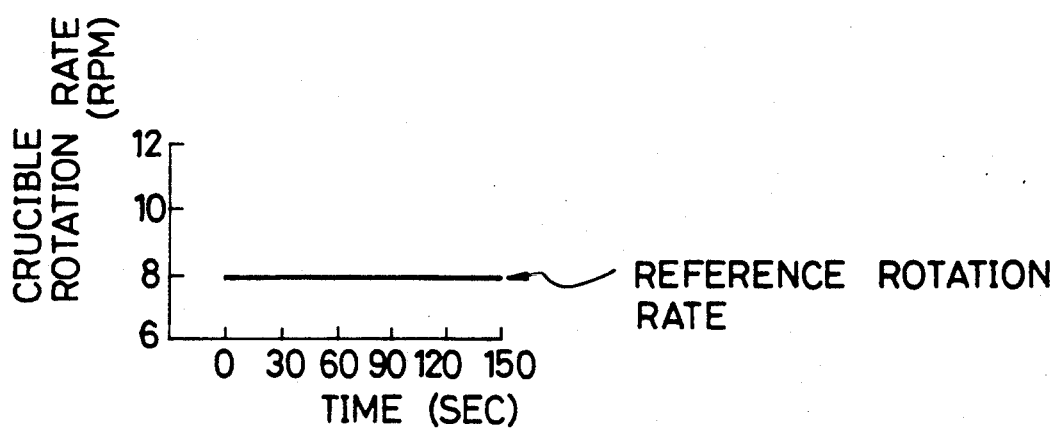
FIG. 4 is a graph showing how the quartz crucible used in Comparison Example 1 rotates.

A silicon single crystal 150 mm in diameter and 40 cm in length was pulled from a quartz crucible 440 mm in internal diameter containing 30 kg of molten silicon. As shown in FIG. 4, the reference rate of rotation of the quartz crucible was 8.0 rpm with the range of change in the rotation rate being null, i.e., no change in the rate.

The measurement of the oxygen concentration of the silicon single crystal thus obtained was conducted in the same process as in Embodiment 1, the result of which is shown in FIGS. 2, 5, 9, 13, 16, 19 and 23 for comparison.

EMBODIMENT 3

Figure 6:
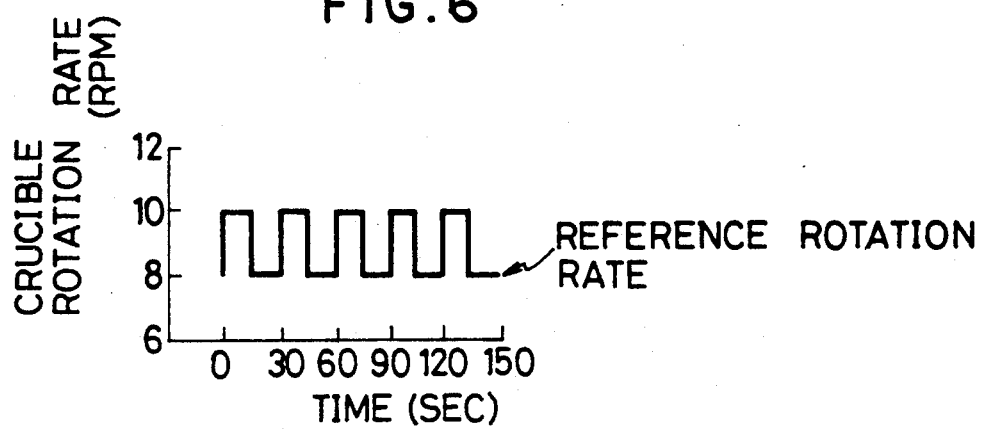
FIG. 6 is a graph showing in part how the quartz crucible used in Embodiment 3 rotates.

Case wherein both the range (2.0 rpm) and the cycle (30 sec; the period of time of reference rotation/the period of time of accelerated rotation = 1/1) of change in the rotation rate are constant As shown in FIG. 6, a silicon single crystal was obtained in the same method as Embodiment 1 except for the cycle of change in the rotation rate being set at 30 sec. The measurement of oxygen concentration of the silicon single crystal was conducted in the same process as Embodiment 1, the result of which is shown in FIG. 5. This figure confirms the oxygen concentration of the silicon single crystal obtained according to the present embodiment was lower than that of Embodiment 1, but higher than that of Comparison Example 1.

EMBODIMENT 4

Figure 7:
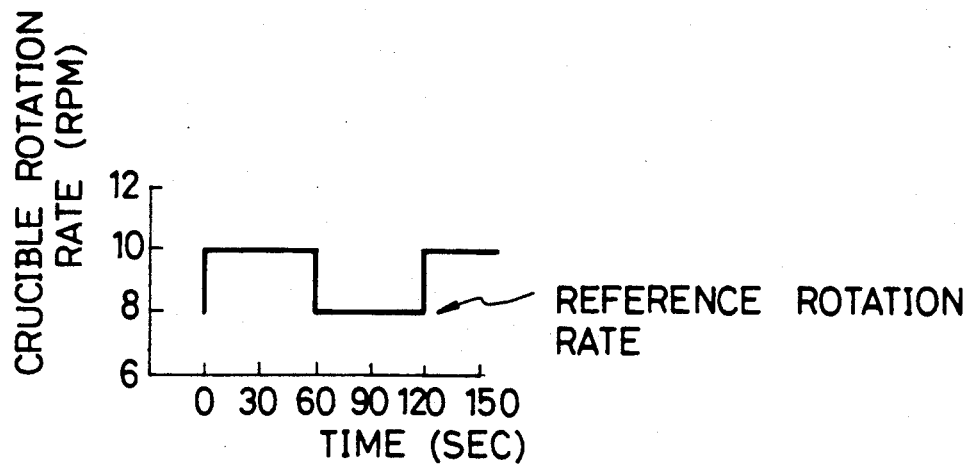
FIG. 7 is a graph showing in part how the quartz crucible used in Embodiment 4 rotates.

Case wherein the range (2.0 rpm) and the cycle (120 sec; the period of time of reference rotation/the period of time of accelerated rotation = 1/1) of chanqe in the rotation rate are constant As shown in FIG. 7, a silicon single crystal was obtained in the same method as Embodiment 1 except for the cycle of change in the rotation rate being set at 120 sec. The measurement of oxygen concentration of the silicon single crystal thus obtained was conducted in the same process as Embodiment 1, the result of which is shown in FIG. 5. This figure confirms that the axial oxygen concentration profile of the silicon single crystal obtained according to the present embodiment was higher in value and improved in uniformity compared with that of Embodiments 1 and 3.

EMBODIMENT 5

Figure 8:
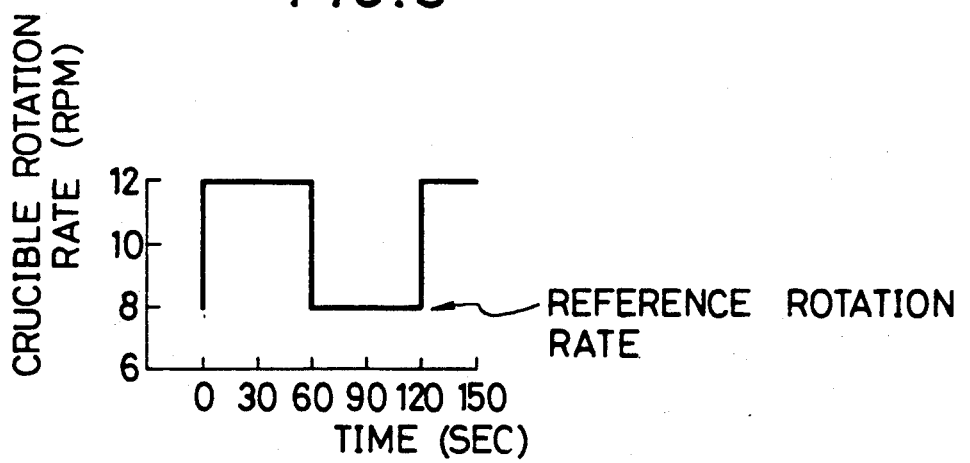
FIG. 8 is a graph showing in part how the quartz crucible used in Embodiment 5 rotates.
Figure 9:
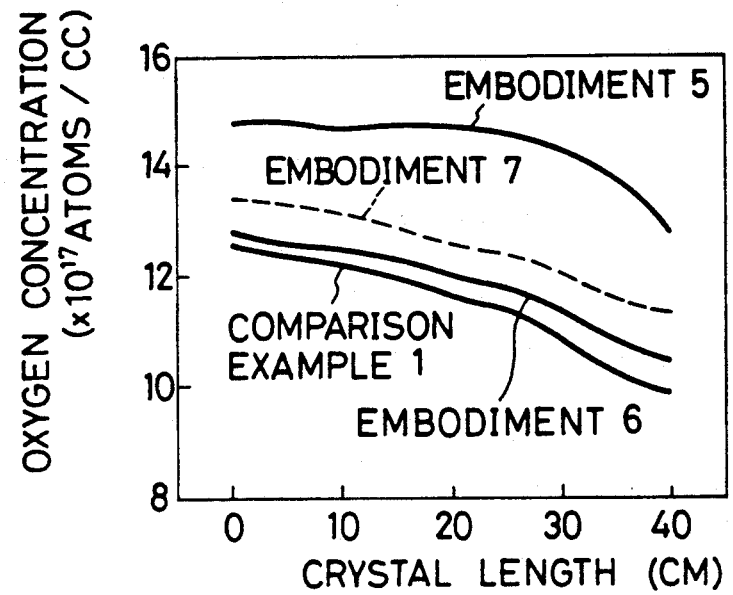
FIG. 9 is a graph showing the axial oxygen concentration of the silicon single crystals obtained according to Embodiments 5 through 7 and Comparison Example 1.

Case wherein both the range (4.0 rpm) and the cycle (120 sec; the period of time of reference rotation/the period of time of accelerated rotation = 1/1) of change in the rotation rate are constant As shown in FIG. 8, a silicon single crystal was obtained in the same method as Embodiment 1 except for the range of change in the rotation rate being set at 4.0 rpm (i. e., the accelerated rate of rotation is 12.0 rpm.) and the cycle of change in the rotation rate being set at 120 sec. The measurement of oxygen concentration of the silicon single crystal thus obtained was conducted in the same process as Embodiment 1, the result of which is shown in FIG. 9. This figure confirms that the axial oxygen concentration profile of the silicon single crystal obtained according to the present embodiment was remarkably increased in value and improved in uniformity compared with that of Comparison Example 1.

EMBODIMENT 6

Figure 10:
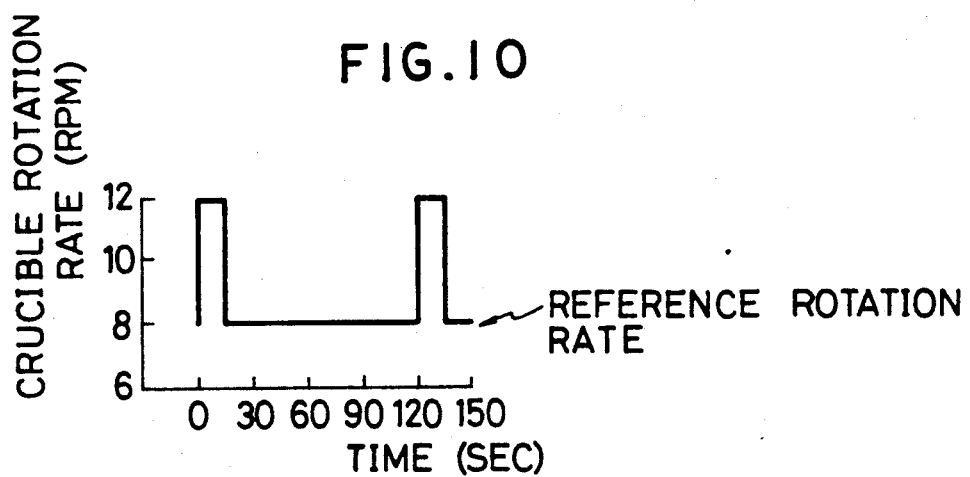
FIG. 10 is a graph showing in part how the quartz crucible used in Embodiment 6 rotates.

Case wherein both the range (4.0 rpm) and the cycle (120 sec; the period of time of reference rotation/the period of time of accelerated rotation=7/1) of change in the rotation rate are constant As shown in FIG. 10, a silicon single crystal was obtained in the same method as Embodiment 5 except for the period of time of reference rotation/the period of time of accelerated rotation=7/1. The measurement of oxygen concentration of the silicon single crystal thus obtained was conducted in the same process as Embodiment 1, the result of which is shown in FIG. 9. This figure confirms that the axial oxygen concentration profile of the silicon single crystal obtained according to the present embodiment was improved in uniformity compared with Comparison Example 1.

EMBODIMENT 7

Figure 11:
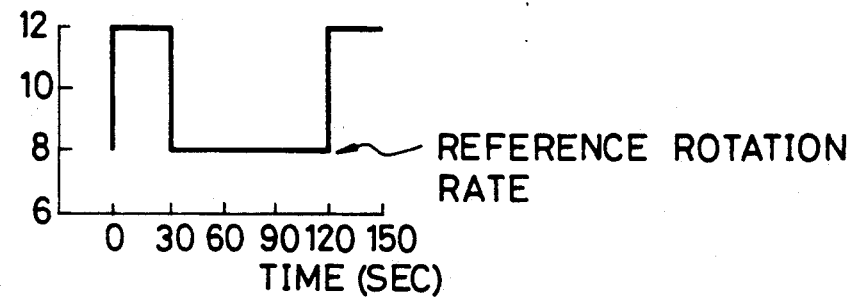
FIG. 11 is a graph showing in part how the quartz crucible used in Embodiment 7 rotates.

Case wherein both the range (4.0 rpm) and the cycle (120 sec; the period of time of reference rotation/the period of time of accelerated rotation=3/1) of change in the rotation rate are constant As shown in FIG. 11, a silicon single crystal was obtained in the same method as Embodiment 5 except for the period of time of reference rotation/the period of time of accelerated rotation=3/1. The measurement of oxygen concentration of the silicon single crystal thus obtained was conducted in the same process as Embodiment 1, the result of which is shown in FIG. 9. This figure confirms that the oxygen concentration of the silicon single crystal obtained according to the present embodiment was lower than that of Embodiment 5, but the profile in the axial direction was improved in uniformity compared with that of Embodiment 6.

EMBODIMENT 8

Figure 12:
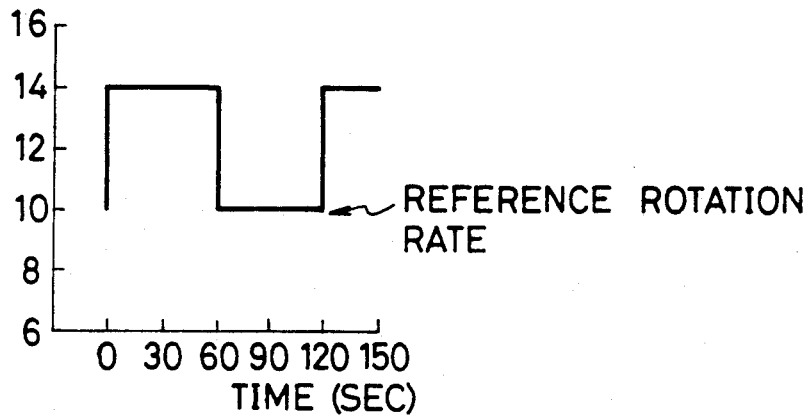
FIG. 12 is a graph showing in part how the quartz crucible used in Embodiment 8 rotates.
Figure 13:
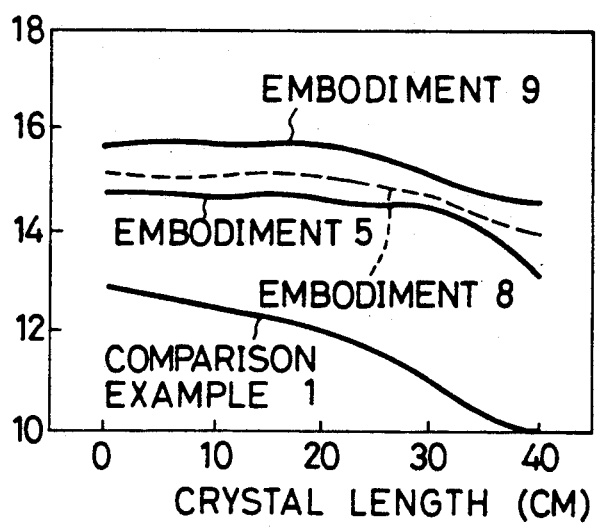
FIG. 13 is a graph showing the axial oxygen concentration of the silicon single crystals obtained according to Embodiments 5, 8 and 9 and Comparison Example 1.

Case wherein both the range (4.0 rpm) and the cycle (120 sec; the period of time of reference rotation/the period of time of accelerated rotation=1/1) of change in the rotation rate are constant with reference rotation rate (10.0 rpm) increased As shown in FIG. 12, a silicon single crystal was obtained in the same method as Embodiment 5 except for the reference rotation rate set at 10.0 rpm. The measurement of oxygen concentration of the silicon single crystal thus obtained was conducted in the same process as Embodiment 1, the result of which is shown in FIG. 13. This figure confirms that the axial oxygen concentration profile of the silicon single crystal obtained according to the present embodiment was improved in uniformity compared with that of Embodiment 5.

EMBODIMENT 9

Figure 14:
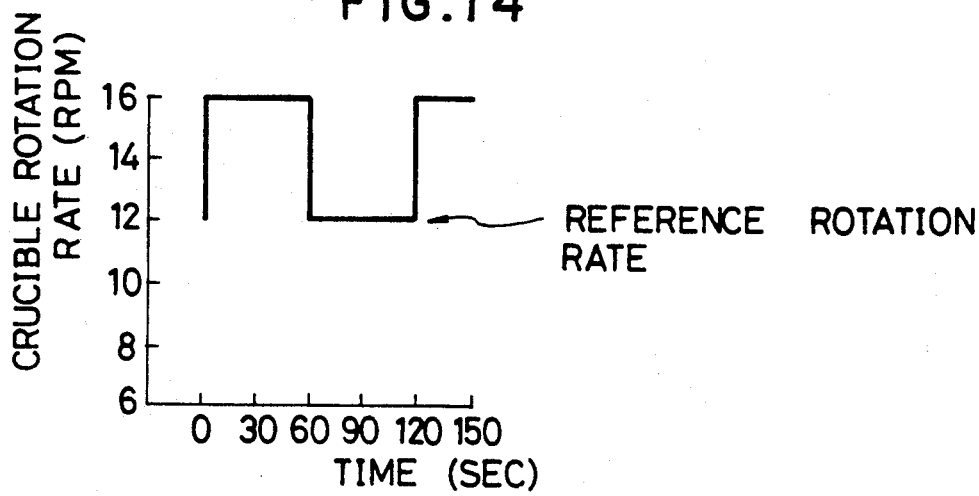
FIG. 14 is a graph showing in part how the quartz crucible used in Embodiment 9 rotates.

Case wherein both the range (4.0 rpm) and the cycle (120 sec; the period of time of reference rotation/the period of time of accelerated rotation=1/1) of change in the rotation rate are constant with reference rotation rate (12.0 rpm) increased As shown in FIG. 14, a silicon single crystal was obtained in the same method as Embodiment 5 except for the reference rotation rate set at 12.0 rpm. The measurement of oxygen concentration of the silicon single crystal thus obtained was conducted in the same process as Embodiment 1, the result of which is shown in FIG. 13. This figure confirms that the axial oxygen concentration profile of the silicon single crystal obtained according to the present embodiment was furthermore improved in uniformity compared with that of Embodiment 8.

EMBODIMENT 10

Figure 15:
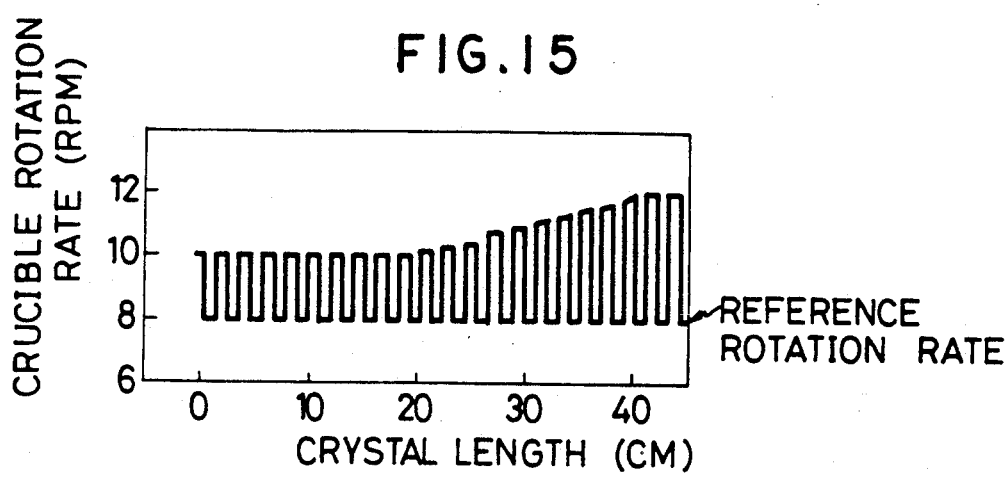
FIG. 15 is a graph showing in part how the quartz crucible used in Embodiment 10 rotates.
Figure 16:
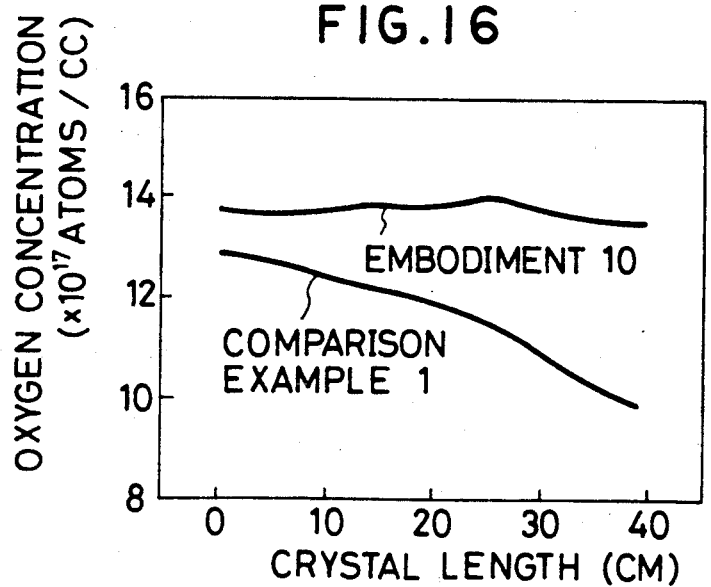
FIG. 16 is a graph showing the axial oxygen concentration of the silicon single crystals obtained according to Embodiment 10 and Comparison Example 1.

Case wherein the cycle (60 sec; the period of time of reference rotation/the period of time of accelerated rotation =1/1) of change in the rotation rate is constant with the range of change in the rotation rate varied As shown FIG. 15, a silicon single crystal was obtained in the same method as Embodiment 1 except that the range of change in the rotation rate of the quartz crucible was maintained at 2.0 rpm for the length of the silicon single crystal in the pulling process being 0 to 20 cm, gradually increased from 2.0 to 4.0 rpm for the length of the silicon single crystal being 20 cm to 40 cm, and maintained at 4.0 rpm for the length of the silicon single crystal being 40 cm and over. The measurement of oxygen concentration of the silicon single crystal thus obtained was conducted in the same process as Embodiment 1, the result of which is shown in FIG. 16. This figure makes it clear that the axial oxygen concentration of the silicon single crystal obtained according to the present embodiment was far improved in its uniformity compared with that of Comparison Example 1, and that such a phenomenon that the longer the pulled length of the silicon single crystal was, the lower the oxygen concentration thereof became, as seen in Comparison Example 1 and Embodiments 1 through 9 was eliminated, that is, the axial oxygen concentration of the silicon single crystal was uniform.

EMBODIMENT 11

Figure 17:
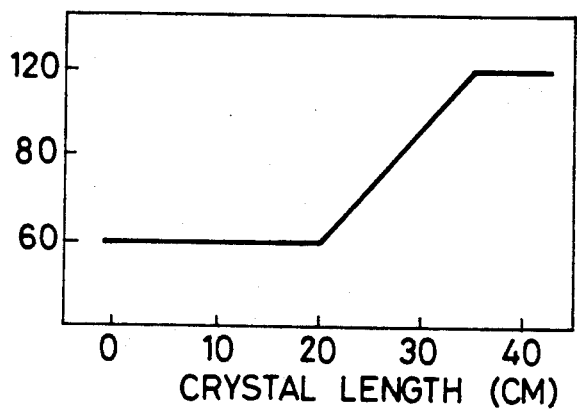
FIG. 17 is a graph showing how the cycle of change in rotation rate of the quartz crucible used in Embodiment 11 is altered.
Figure 18:
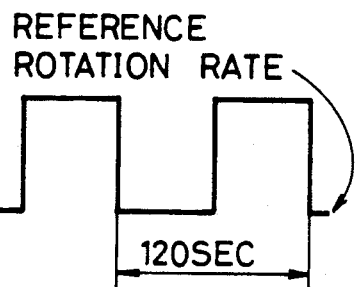
FIG. 18 is a graph showing schematically how the quartz crucible used in Embodiment 11 rotates.
Figure 19:
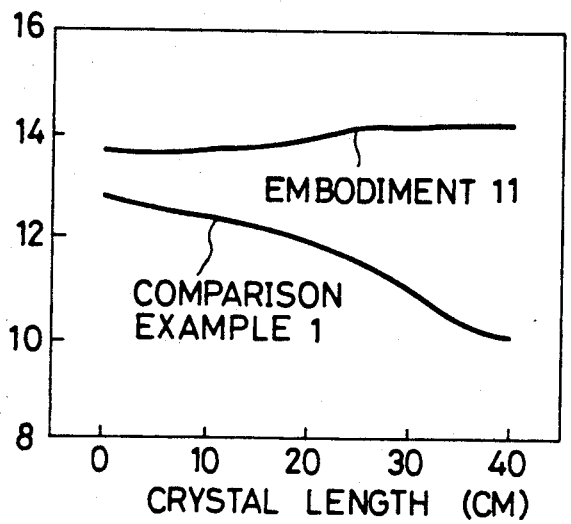
FIG. 19 is a graph showing the axial oxygen concentration of the silicon single crystals obtained according to Embodiment 11 and Comparison Example 1.

Case wherein the range (2.0 rpm) and the period of time of reference rotation/the period of time of accelerated rotation=1/1 is constant with only the cycle of change in the rotation rate varied As shown in FIG. 17, a silicon single crystal was obtained in the same method as Embodiment 1 except that the cycle of change in the rotation rate of the quartz crucible was maintained at 60 sec for the length of the silicon single crystal in the pulling process being 0 to 20 cm, gradually lengthened from 60 to 120 sec for the length of the silicon single crystal being 20 to 35 cm, and maintained at 120 sec for the length of the silicon single crystal being 35 cm and over. It is to be noted that FIG. 18 typically shows how the cycle of change in the rotation rate of the quartz crucible is varied. The measurement of oxygen concentration of the silicon single crystal thus obtained was conducted in the same process as Embodiment 1, the result of which is shown in FIG. 19. This figure makes it clear that the oxygen concentration of the silicon single crystal obtained according to the present embodiment was far improved in profile uniformity compared with that of Comparison Example 1, and that such a phenomenon that the longer the pulled length of the silicon single crystal was, the lower the oxygen concentration thereof became, as seen in Comparison Example 1 and Embodiments 1 through 9 was eliminated, that is, the axial oxygen concentration of the silicon single crystal was uniform.

EMBODIMENT 12

Figure 20:
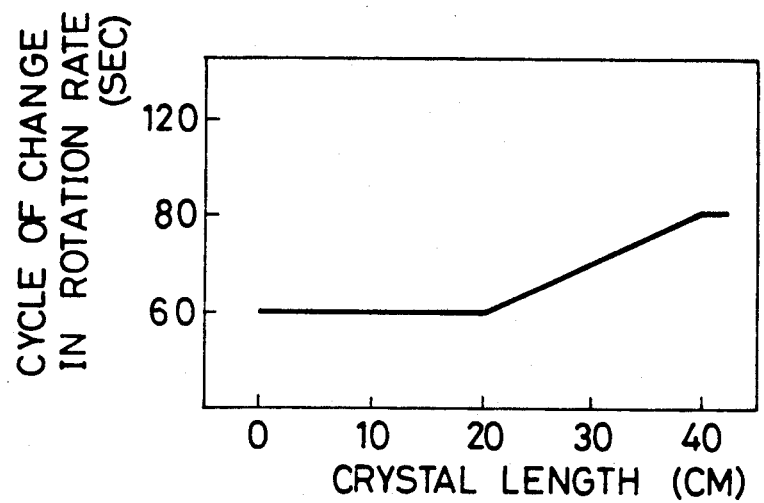
FIG. 20 is a graph showing how the cycle of change in rotation rate of the quartz crucible used in Embodiment 11 is altered.
Figure 21:
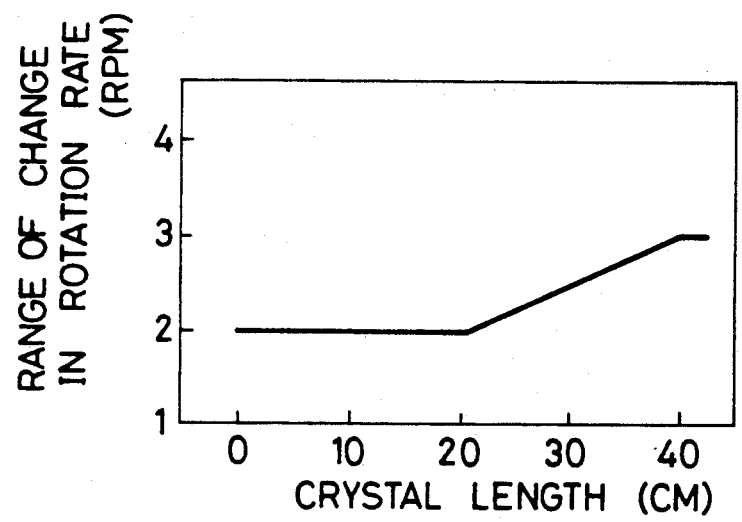
FIG. 21 is a graph showing how the rotation rate of the quartz crucible used in Embodiment 12 is changed.
Figure 22:
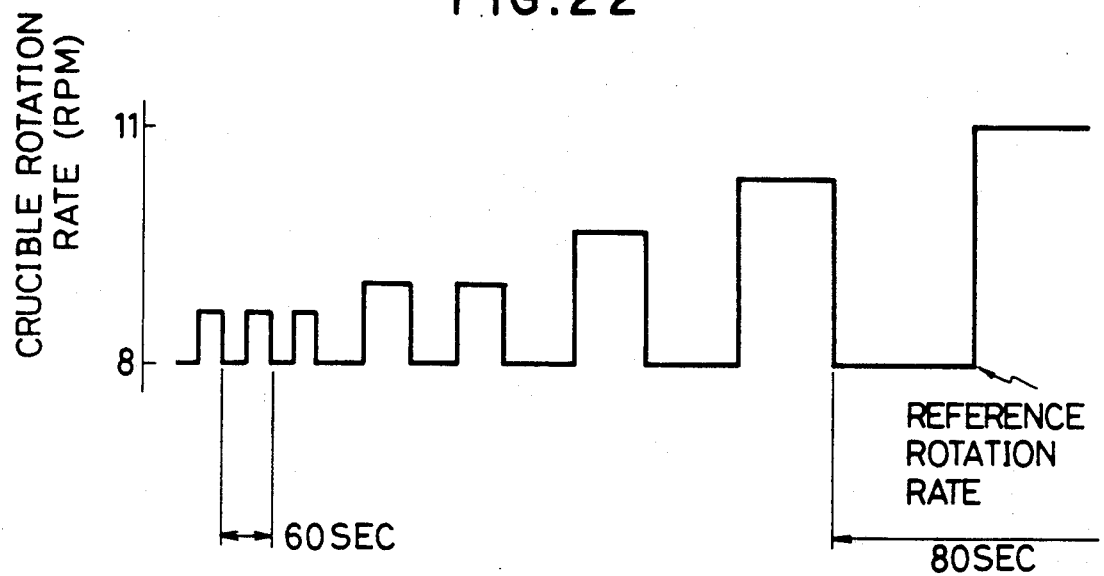
FIG. 22 is a graph showing schematically how the quartz crucible used in Embodiment 12 rotates.
Figure 23:
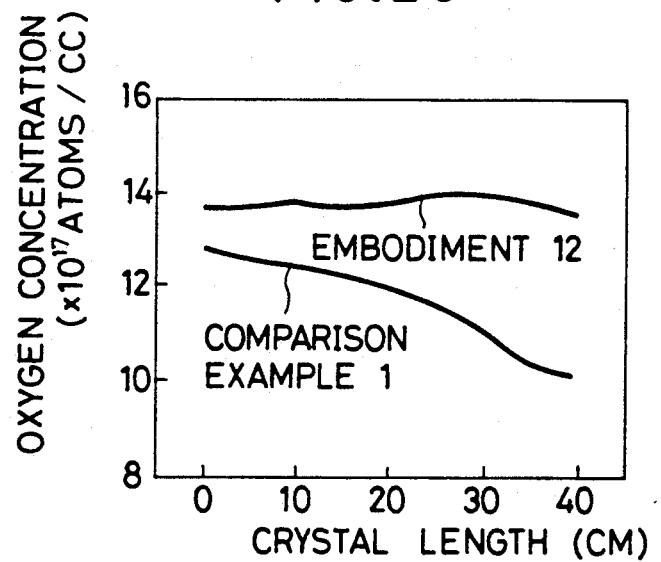
FIG. 23 is a graph showing the axial oxygen concentration of the silicon single crystals obtained according to Embodiment 12 and Comparison Example 1.

Case wherein the period of time of reference rotation/the period of time of accelerated rotation=1/1 is constant with both the range and the cycle of change in the rotation rate altered A silicon single crystal was obtained in the same method as Embodiment 1 except that as shown in FIG. 20, the cycle of change in the rotation rate of the quartz crucible was maintained at 60 sec for the length of the silicon single crystal in the pulling process being 0 to 20 cm, gradually lengthened from 60 to 80 sec for the length of the silicon single crystal being 20 to 40 cm, and maintained at 80 sec for the length of the silicon single crystal being 40 cm and over, and except that, as shown in FIG. 21, the range of change in the rotation rate of the quartz crucible was maintained at 2.0 rpm for the length of the silicon single crystal in the pulling process being 0 to 20 cm, gradually lengthened from 2.0 rpm to 3.0 rpm for the length of the silicon single crystal being 20 to 40 cm and maintained at 3.0 rpm for the length of the silicon crystal being 40 cm and over. FIG. 22 shows schematically how both the range and the cycle of change in the rotation rate of the quartz crucible are varied. The measurement of oxygen concentration of the silicon single crystal thus obtained was conducted in the same process as Embodiment 1, the result of which is shown in FIG. 23. This figure makes it clear that the oxygen concentration of the silicon single crystal obtained according to the present embodiment was far improved in profile uniformity compared with that of Comparison Example 1, and that such a phenomenon that the longer the pulled length of the silicon single crystal was, the lower the oxygen concentration thereof became, as seen in Comparison Example 1 and Embodiments 1 through 9 was eliminated, that is, the axial oxygen concentration of the silicon single crystal was uniform.

EMBODIMENT 13

Case wherein both the range (6.0 rpm) and the cycle (60 sec; the period of time of reference rotation/the period of time of accelerated rotation=1/1) of change in the rotation rate are constant A silicon single crystal 150 mm in diameter and about 80 cm in length was pulled from a quartz crucible 440 mm in internal diameter containing 60 kg of molten silicon under the conditions written below. The reference rate of rotation of the quartz crucible was 8.0 rpm, the range of change in the rotation rate was maintained at 6.0 rpm (i.e., the accelerated rate of rotation was 14.0 rpm.), and the cycle of change in the rate was also maintained at 60 sec (the period of time of reference rotation/the period of time of accelerated rotation=1/1). The crystal rotation rate was 20 rpm in the reverse direction relative to the quartz crucible rotation.

Figure 24:
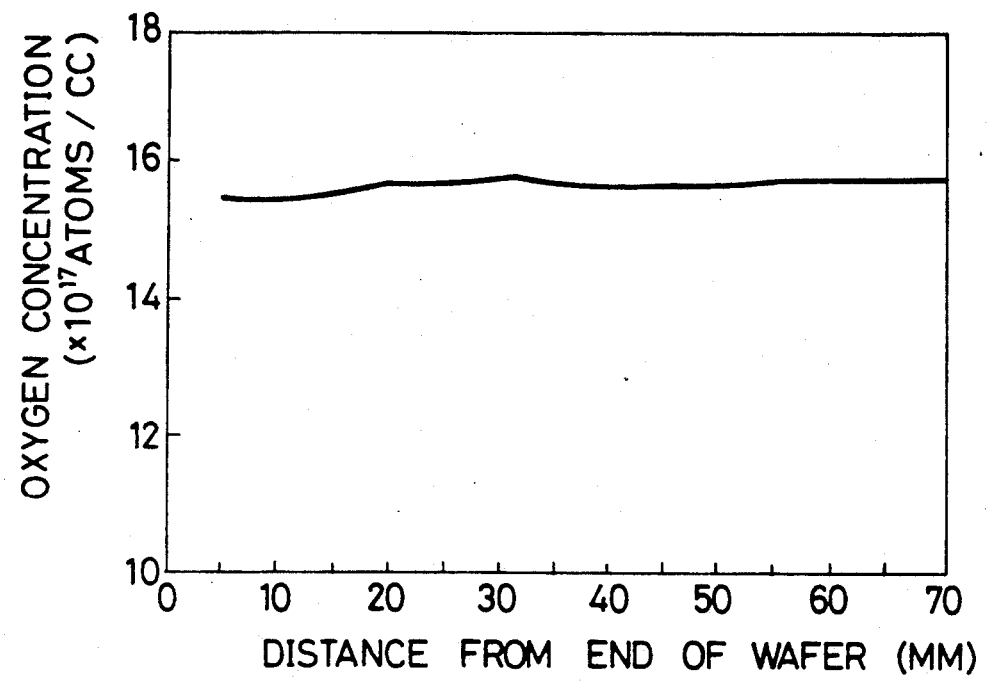
FIG. 24 is a graph showing the radial oxygen concentration of the silicon single crystal obtained according to Embodiment 13.

The measurements of the radial oxygen concentration distribution of a wafer cut out at the position 65 cm away from the shoulder portion of the silicon single crystal thus obtained are shown in FIG. 24. This figure indicates that the radial oxygen concentration distribution of the silicon single crystal obtained according to the present embodiment was far more uniform than that of the silicon single crystal obtained according to the conventional process (Comparison Example 2 to be described later). It is to be noted that the measurement of the radial oxygen concentration of the silicon single crystal was conducted as follows: A position 5 mm away from the periphery of the wafer cut out from the silicon single crystal was set as a starting point, therefrom the oxygen concentration was measured at positions located at an interval of 5 mm towards the center of the wafer by way of Fourier transform infrared absorption spectrophotometer, as in Embodiment 1.

COMPARISON EXAMPLE 2

Case wherein no change in the rotation rate is made (a conventional method)

A silicon single crystal 150 mm in diameter and about 80 cm in length was pulled from a quartz crucible 440 mm in internal diameter containing 60 kg of molten silicon under the conditions written below. The reference rotation rate of the quartz crucible was maintained at 15.0 rpm. No change in the rotation rate was made. The crystal rotation rate was 20 rpm in the reverse direction relative to the quartz crucible rotation.

Figure 25:
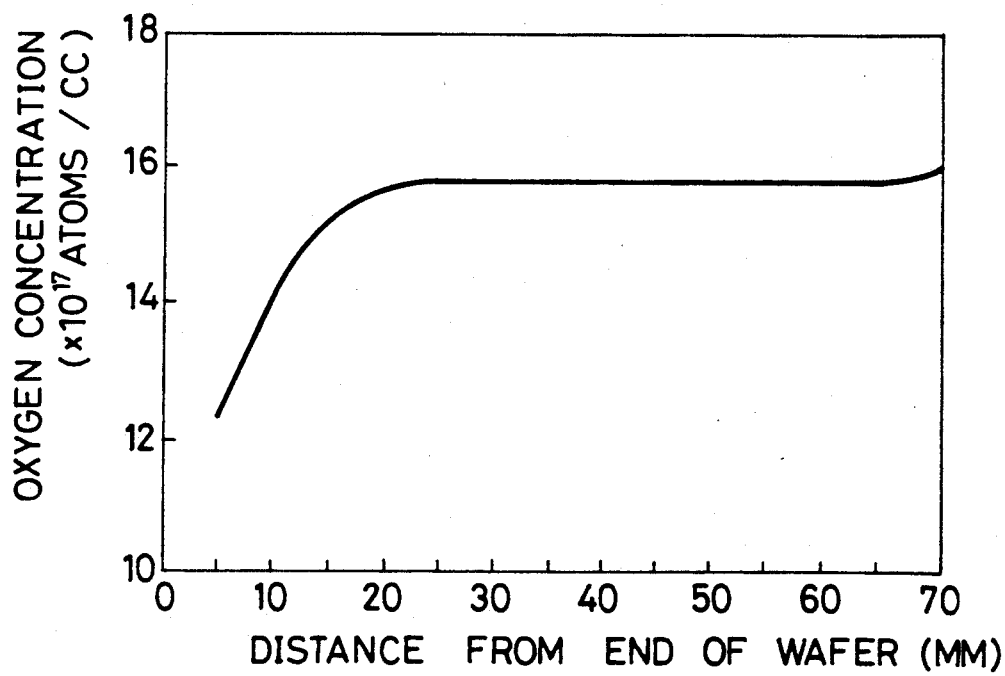
FIG. 25 is a graph showing the radial oxygen concentration of the silicon single crystal obtained according to Comparison Example 2.

The measurements of the radial oxygen concentration distribution of a wafer cut out at the position 65 cm away from the shoulder portion of the silicon single crystal in the same method as Embodiment 13 is shown in FIG. 25. This figure indicates that the central oxygen concentration distribution of the wafer was uniform but abruptly lowered in the vicinity of the periphery. This means that the radial oxygen concentration distribution was extremely uneven. The differences between the maximum and the minimum values amounted to 25% of the minimum.

As stated above, the method for pulling silicon single crystal according to the present invention allows (a) to pull a silicon single crystal with a high oxygen concentration with ease, (b) to make even the radial and axial oxygen concentration and (c) to prepare industrially crystals provided with a desired axial oxygen concentration profile or crystals provided with a desired oxygen concentration level, because the process according to the present invention permits the pulse-pattern change in the crucible rotation rate to be superimposed to the reference rotation rate, thereby enabling to know in advance the effect of the change in the crucible rotation rate. This brings about a great industrial success.

What is claimed is:

1. A method for pulling a silicon single crystal wherein a program controls a crucible rotation rate of a quartz crucible such that an additive rotation rate is superimposed on a constant reference rotation rate, said additive rotation rate is a pulsed, square wave function of time having an amplitude, wherein differences in cycle time of the additive rotation rate are set according to said program, and pulling said single crystal from said quartz crucible having a crucible rotation rate of between 0.1 and 50 rpm according to the Czochralski process.

2. A method for pulling a silicon single crystal as defined in claim 1 wherein a pattern of change with passage of time in said additive rotation rate is periodic.

3. A method for pulling a silicon single crystal as defined in claim 2 wherein said amplitude is set to gradually increase in accordance with progress in pulling of said silicon single crystal.

4. A method for pulling a silicon single crystal as defined in claim 1 wherein a first said crucible rotation rate is retained for a period of time, and a second said crucible rotation rate, not equal to said first crucible rotation rate, is retained for a longer period of time.

5. A method for pulling a silicon single crystal comprising the steps of:
   setting a reference rotation rate for a quartz crucible;
   superimposing a pulsed, square wave function of time rotation rate onto the reference rotation rate to obtain a crucible rotation rate which increases and decreases, in a cyclic pattern, with a passage of time;
   rotating the quartz crucible at the crucible rotation rate, whereby the quartz crucible is subjected to said pulsed, square wave function of time rotaiton rate; and
   pulling a single silicon crystal from the rotating quartz crucible according to the Czochralski process, wherein the reference rotation rate is set to between 0.1 and 50 rpm and the superimposed pulsed, square wave function of time rotation rate has a range of between 0.1 and 50 rpm.

6. The method for pulling a silicon single crystal as recited in claim 5, wherein the period for which the pulsed, square wave function of time rotation rate is increased in each cycle is selected to be between 1 and 600 sec.

7. The method of pulling a silicon single crystal as recited in claim 6, wherein the period is selected to be between 10 and 180 sec.

8. The method for pulling a silicon single crystal as recited in claim 7, wherein a ratio between the period for which the pulsed, square wave function of time rotation rate is increased, and a period for which the pulsed, square wave function of time rotation rate is decreased, is selected to be between 99:1 and 1:99.

9. The method for pulling a silicon single crystal as recited in claim 8, wherein the ratio is selected to be between 8:2 and 2:8.

10. A method for pulling a silicon single crystal comprising the steps of:
    providing a crucible containing molten silicon;
    rotating the crucible at a crucible rotation rate which is a combination of a reference rotation rate and a pulsed, square wave function of time rotation rate having an amplitude of at least 0.1 rpm, wherein the lower and upper limits of the crucible rotation rate are 0.1 and 50 rpm, respectively; and
    pulling a single silicon crystal from the rotating quartz crucible according to the Czochralski process.

11. The method for pulling a silicon crystal as recited in claim 10, wherein the period for which the pulsed, square wave function of time rotation rate is at the upper limit in each cycle is selected to be between 1 and 600 sec.

12. The method for pullinsg a silicon single crystal as recited in claim 11, wherein the period is selected to be between 10 and 180 sec.

13. The method for pulling a silicon single crystal as recited in claim 12, wherein a ratio between the period for which the pulsed, square wave function of time rotation rate is at the upper limit, and a period for which the pulsed, square wave function of time rotation rate is at the lower limit, is selected to be between 99:1 and 1:99.

14. The method for pulling a silicon single crystal as recited in claim 13, wherein the ratio is selected to be between 2:8 and 8:2.

* * * * *